US010041854B2

(12) United States Patent
Coronato et al.

(10) Patent No.: US 10,041,854 B2
(45) Date of Patent: Aug. 7, 2018

(54) IDENTIFICATION OF A SEAL FAILURE IN MEMS DEVICES

(71) Applicant: PANASONIC CORPORATION, Osaka (JP)

(72) Inventors: Luca Coronato, Corsico (IT); Giacomo Gafforelli, Casatenovo (IT); Adolfo Giambastiani, San Marco (IT)

(73) Assignee: Panasonic Corporation, Osaka (JP)

( * ) Notice: Subject to any disclaimer, the term of this patent is extended or adjusted under 35 U.S.C. 154(b) by 94 days.

(21) Appl. No.: 15/258,720

(22) Filed: Sep. 7, 2016

(65) Prior Publication Data

US 2017/0167945 A1 Jun. 15, 2017

Related U.S. Application Data

(60) Provisional application No. 62/265,913, filed on Dec. 10, 2015.

(51) Int. Cl.
| | |
|---|---|
| *G01P 1/02* | (2006.01) |
| *G01P 15/08* | (2006.01) |
| *G01M 3/26* | (2006.01) |
| *G01C 19/5776* | (2012.01) |
| *G01C 19/5783* | (2012.01) |

(52) U.S. Cl.
CPC .......... *G01M 3/26* (2013.01); *G01C 19/5776* (2013.01); *G01C 19/5783* (2013.01)

(58) Field of Classification Search
CPC .... B81B 2201/0235; B81B 2201/0242; B81B 7/0041; G01C 19/5776; G01C 19/5783; G01M 3/26; G01P 15/18; G01P 1/023; G01P 15/02; G01P 2015/088; G01P 21/00
See application file for complete search history.

(56) References Cited

U.S. PATENT DOCUMENTS

| | | | |
|---|---|---|---|
| 6,638,784 B2 | 10/2003 | Bartlett et al. | |
| 8,513,747 B1 | 8/2013 | Huang et al. | |
| 9,400,288 B2* | 7/2016 | Feyh | G01P 15/0802 |
| 9,499,397 B2 | 11/2016 | Bowles et al. | |
| 2007/0084270 A1 | 4/2007 | Jarrett | |
| 2010/0139373 A1* | 6/2010 | Braman | B81B 7/0041 |
| | | | 73/40.7 |
| 2011/0048129 A1 | 3/2011 | Yamanaka et al. | |
| 2013/0320466 A1* | 12/2013 | Chen | G01P 15/0802 |
| | | | 257/417 |
| 2013/0340524 A1 | 12/2013 | Maeda et al. | |
| 2014/0150553 A1* | 6/2014 | Feyh | G01P 15/0802 |
| | | | 73/514.31 |

(Continued)

*Primary Examiner* — David A Rogers
(74) *Attorney, Agent, or Firm* — McDermott Will & Emery LLP

(57) ABSTRACT

A microelectromechanical sensor (MEMS) package includes a gyroscope and an accelerometer. The gyroscope is located within a low-pressure cavity that is sealed from an external pressure. The accelerometer is located within a cavity, and the seal for the accelerometer cavity is entirely within the gyroscope cavity. Under normal operating conditions, the accelerometer seal holds the accelerometer cavity at a higher pressure than the pressure of the enclosing gyroscope cavity. In the event that one of the gyroscope seal or the accelerometer seal is broken, the gyroscope senses the change in pressure and a failure is identified.

20 Claims, 5 Drawing Sheets

(56) References Cited

U.S. PATENT DOCUMENTS

| | | | |
|---|---|---|---|
| 2014/0250971 A1* | 9/2014 | Fang | G01P 21/00 |
| | | | 73/1.37 |
| 2014/0260515 A1 | 9/2014 | Hazel et al. | |
| 2014/0311242 A1* | 10/2014 | Lee | G01C 19/5783 |
| | | | 73/504.12 |
| 2016/0229687 A1* | 8/2016 | Wen | B81C 1/00293 |
| 2018/0002163 A1* | 1/2018 | Boysel | B81B 7/007 |
| 2018/0002166 A1* | 1/2018 | Chang | B81C 1/00269 |

* cited by examiner

IDENTIFICATION OF A SEAL FAILURE IN MEMS DEVICES

BACKGROUND

Numerous items such as smart phones, smart watches, tablets, automobiles, aerial drones, appliances, aircraft, exercise aids, and game controllers may utilize motion sensors during their operation. In many applications, various types of motion sensors such as accelerometers and gyroscopes may be analyzed independently or together in order to determine varied information for particular applications. For example, gyroscopes and accelerometers may be used in gaming applications (e.g., smart phones or game controllers) to capture complex movements by a user, drones and other aircraft may determine orientation based on gyroscope measurements (e.g., roll, pitch, and yaw), and vehicles may utilize measurements for determining direction (e.g., for dead reckoning) and safety (e.g., to recognizing skid or roll-over conditions).

Motion sensors such as accelerometers and gyroscopes may be manufactured as microelectromechanical (MEMS) sensors that are fabricated using semiconductor manufacturing techniques. A MEMS sensor may include movable masses that can respond to forces such as linear acceleration (e.g., for MEMS accelerometers) and angular velocity (e.g., for MEMS gyroscopes). The operation of these forces on the movable masses may be measured based on the movement of the masses in response to the forces. In some implementations, this movement is measured based on distance between the movable masses and sense electrodes, based on the variation of a capacitance formed by each movable mass and its respective electrode.

The movable masses of an exemplary MEMS accelerometer may include one or more suspended masses that deflect in response to linear acceleration. The components of the MEMS accelerometer may be sealed in order to prevent contamination of the environment of the MEMS accelerometer by outside contaminants such as moisture. Such contaminants may affect the operation (e.g., the movement of the movable masses in response to linear acceleration) or otherwise damage components of the MEMS accelerometer. If the seal of the MEMS accelerometer is broken, the contaminants may enter the cavity and the accelerometer may fail. The seal of the MEMS accelerometer may also maintain a pressure that is sufficient to provide damping for the movable masses of the accelerometer.

A MEMS gyroscope may also operate within a sealed environment. MEMS gyroscopes require one or more of the movable masses to be driven at a high frequency, and the operational characteristics of the gyroscope (e.g., a "quality factor" or "q-factor") may depend up on the environment in which the gyroscope is operating. For example, the q-factor may change based on temperature and may be highly pressure dependent. Many MEMS gyroscopes may need a low pressure such as a high vacuum environment to operate normally. An increase in pressure may result in the lowering of the q-factor.

SUMMARY OF THE INVENTION

In an embodiment of the present disclosure, a microelectromechanical sensor (MEMS) package comprises a first cavity enclosed by a first cavity seal that provides a barrier between a first cavity pressure within the first cavity and an external pressure, as well as a second cavity enclosed by a second cavity seal that is located entirely within the first cavity seal to provide a barrier between a second cavity pressure within the second cavity and the first cavity pressure. In an embodiment, a MEMS accelerometer is located within the second cavity and configured to measure one or more linear accelerations and a MEMS gyroscope is located within the first cavity and configured to measure one or more angular velocities. In an embodiment, the MEMS gyroscope is further configured to sense a change in pressure within the first cavity when at least one of the first cavity seal or the second cavity seal has been broken and processing circuitry is coupled to the MEMS gyroscope to identify a failure based on the change in pressure sensed by the MEMS gyroscope.

In an embodiment of the present disclosure, a method for sensing a change in pressure within a microelectromechanical sensor (MEMS) package comprises determining one or more angular velocities from a MEMS gyroscope, wherein the MEMS gyroscope is located within a first cavity, wherein the first cavity is enclosed by a first cavity seal, wherein the first cavity seal provides a barrier between a first cavity pressure within the first cavity and an external pressure. In an embodiment, the method further comprises determining one or more linear accelerations from a MEMS accelerometer, wherein the MEMS accelerometer is located within a second cavity enclosed by a second cavity seal, and wherein the second cavity seal is located entirely within the first cavity seal to provide a barrier between a second cavity pressure within the second cavity and the first cavity pressure. In an embodiment, the method further comprises sensing, by the MEMS gyroscope, a change in pressure within the first cavity when at least one of the first cavity seal or the second cavity seal has been broken, and identifying, by processing circuitry, a failure based on the change in pressure sensed by the MEMS gyroscope.

In an embodiment of the present disclosure, a multi-sensor microelectromechanical sensor (MEMS) package comprises a gyroscope configured to measure angular velocity about one or more axes of rotation and an accelerometer configured to measure linear acceleration along one or more axes. In an embodiment, the gyroscope comprises a plurality of gyroscope movable masses, one or more drive electrodes to drive one or more of the plurality of gyroscope movable masses, wherein the one or more drive electrodes are driven by a drive voltage, and one or more gyroscope sense electrodes to sense the movement of one or more of the plurality of gyroscope movable masses based on a sense voltage of the gyroscope sense electrodes. In an embodiment, the accelerometer comprises one or more accelerometer movable masses and one or more accelerometer sense electrodes to sense the movement of the one or more accelerometer movable masses. In an embodiment, an accelerometer seal ring encloses the accelerometer cavity and provides an accelerometer pressure for an accelerometer cavity within the accelerometer seal ring, and a gyroscope seal ring encloses the gyroscope and the entirety of the accelerometer seal ring, such the gyroscope seal ring provides a gyroscope pressure for a gyroscope cavity within the gyroscope seal ring, and such that the accelerometer seal ring provides a barrier between the accelerometer pressure and the gyroscope pressure. In an embodiment, processing circuitry is configured to sense a change in pressure within the gyroscope cavity based on at least the drive voltage or the sense voltage, and to identify a failure based on the change in pressure.

BRIEF DESCRIPTION OF THE DRAWINGS

The above and other features of the present disclosure, its nature and various advantages will be more apparent upon consideration of the following detailed description, taken in conjunction with the accompanying drawings in which.

DETAILED DESCRIPTION

A motion processing system may include a plurality of sensors such as accelerometers that measure linear acceleration and gyroscopes that measure angular velocity. In some instances these sensors may be implemented as MEMS sensors having extremely small movable masses that are used for sensing. Linear acceleration and angular velocity are measured based on the movement of these movable masses, which may be sensed by methods such as electrodes located adjacent to the movable masses.

MEMS accelerometers operate optimally under certain pressure conditions. In some embodiments, it is desired that a MEMS accelerometer operate in an environment that is typically less than atmospheric pressure but that is high enough to provide damping for the movement of the movable masses. Under too low of pressures, a MEMS accelerometer may have a high q-factor which results in excessive or unpredictable movement in response to linear accelerations.

MEMS gyroscopes similarly operate optimally under certain pressure conditions. A high q-factor is typically provided for a MEMS gyroscope, which is achieved by placing the MEMS gyroscope within a high vacuum environment with a pressure that deviates from an exemplary MEMS accelerometer pressure by an order of magnitude or more. In order to achieve these pressures, both MEMS accelerometers and MEMS gyroscopes are sealed. In addition to maintaining the desired pressures, the seal prevents contaminants from entering the environment of the MEMS device.

In an embodiment, a gyroscope seal creates a gyroscope cavity defining a gyroscope volume in which the gyroscope is located. The accelerometer seal is located entirely within the gyroscope cavity. In this manner, any breakage of the accelerometer seal will cause an increase in pressure within the gyroscope cavity, as the pressures between the two cavities attempt to equalize.

The gyroscope may be used to measure these changes in pressure, based on changes in q-factor, drive voltages, sense voltage, and other characteristics that are indicative of pressure. Depending upon the change in pressure, or rate of change in pressure, a failure may be indicated for one or both of the accelerometer and gyroscope, and in some embodiments, compensation may be applied to allow one or both of the devices to continue to operate. In some embodiments, measurements determined by the gyroscope may be used to determine different failure conditions such as determining which of the accelerometer seal or gyroscope seal has been broken.

Figure 1:
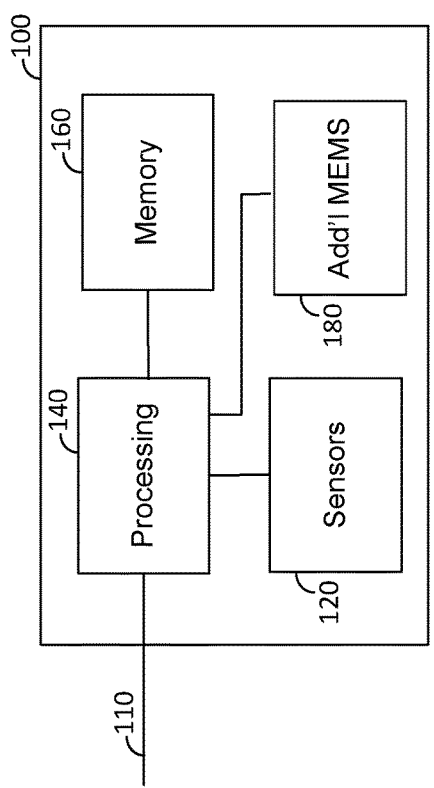
FIG. 1 depicts an illustrative motion processing system in accordance with some embodiments of the present disclosure.

FIG. 1 depicts an exemplary motion processing system 100 in accordance with some embodiments of the present disclosure. Although particular components are depicted in FIG. 1, it will be understood that any suitable combination of sensors, processing components, memory, and other circuitry may be utilized as necessary for different applications and systems. In an embodiment as described herein, the motion processing system may include MEMS sensors 120 and supporting circuitry, such as processing circuitry 140 and memory 160. In some embodiments, one or more additional MEMS devices 180 (e.g., MEMS microphones, MEMS pressure sensors, and a compass) may be included within the motion processing system 100 to provide an integrated motion processing unit ("MPU") (e.g., including 3 axes of MEMS gyroscope sensing, 3 axes of MEMS accelerometer sensing, microphone, pressure sensor, and compass).

In an embodiment, MEMS sensors 120 may include a sensor package that senses both linear acceleration and angular velocity about one or more axes. Linear acceleration may be sensed by one or more MEMS accelerometers having movable masses that are suspended such that they move (e.g., deflect) in response to a linear acceleration along a particular axis. A MEMS accelerometer may sense the movement of the movable mass utilizing a sensing technique such as an electrode that is at a fixed location such that the movable mass and fixed electrode function as capacitive plates. Each of the movable mass and the fixed electrode are at particular voltages, such that when the movable mass moves relative to the fixed electrode a sense voltage may be determined. In embodiments, a "sense voltage" may be a voltage of a capacitor formed by the movable masses and the sense electrodes, a voltage that is proportional to a current that is readout using a charge amplifier and that is proportional to the capacitance between the movable mass and fixed electrode, or other suitable voltage values that are based on the change in distance between the movable masses and fixed sensing components.

In an exemplary embodiment, each of a plurality of MEMS accelerometers may be configured in a manner such that the movable mass of the MEMS accelerometer responds to a linear acceleration along a particular axis (e.g., an X-axis MEMS accelerometer to sense linear acceleration along the X-axis, a Y-axis MEMS accelerometer to sense linear acceleration along the Y-axis, and a Z-axis MEMS accelerometer to sense linear acceleration along the Z-axis).

The sensor package of the MEMS sensors 120 may also include one or more MEMS gyroscopes for sensing angular velocity about one or more axes. An exemplary MEMS gyroscope may include micromechanical masses that are suspended by springs in a manner that allows the MEMS gyroscope to measure rotation about one or more axes (e.g., pitch, roll, and/or yaw). In some embodiments, MEMS gyroscopes are designed in a manner that allows angular velocity about multiple axes to be sensed by a single MEMS gyroscope (e.g., two or three axis MEMS gyroscopes), while in other embodiments a MEMS gyroscope may sense angular velocity about a single axis.

In operation, one or more of the movable masses of the MEMS gyroscope (e.g., a drive oscillator such as one or more drive masses) may be caused to vibrate at a drive frequency, typically through an electrostatic drive system such as drive electrodes or drive combs. The components (e.g., a drive oscillator such as drive masses) are caused to vibrate at the drive frequency in a drive direction. In some embodiments, drive sense electrodes may sense the movement of a drive mass, for example, by forming a capacitor with the moving drive oscillator. The voltage that is sensed by the drive sense electrodes may be proportional to the movement of the drive oscillator in response to the drive force, and may be used in a feedback system (e.g., closed loop or open loop) to control the drive force imparted by the electrostatic drive system in a manner that maintains a desired drive movement.

Although it may be possible to measure rotation from the drive oscillator, in many gyroscopes a sense oscillator (e.g., Coriolis masses, proof masses, sense masses, etc.) is coupled to the drive oscillator by springs, which often restrict the freedom of motion of the masses in certain directions based on the spring design and placement. A mass (e.g., a Coriolis mass or a sense mass of a sense oscillator) that is vibrating in the drive direction may experience a force as a result of rotation of gyroscope about an axis. This Coriolis force is imparted on the mass in a direction (i.e., the sense direction) that is perpendicular to both the drive direction and the axis about which the gyroscope is rotating. When a mass (e.g., a sense mass of a sense oscillator) that experiences a Coriolis force is free to move in the sense direction (e.g., based on the configuration of the sense oscillator), this mass will oscillate in the sense direction at the drive frequency.

In some embodiments, angular velocity may be measured by sensing this movement of the sense oscillator (e.g., a sense mass). Although the movement may be sensed in any suitable manner (e.g., optical, piezoelectric, etc.), in an embodiment the movement may be sensed based on the relative distance between the moving electrodes of the sense mass and fixed sense electrodes. In some embodiments, the sense electrode may be attached to a parallel substrate below the sense mass (e.g., as a sense plate) or anchored to the substrate and located in the plane of the sense mass (e.g., as a sense plate or sense combs). The sense mass and the opposing sense electrode effectively form a capacitor, the value of which varies based on the distance between the sense mass and the sense electrode. The magnitude of the capacitance change varies based on the magnitude of the Coriolis force, and is used (e.g., by processing of the processing circuitry 140) to determine angular velocity.

Processing circuitry 140 may include one or more components providing necessary processing based on the requirements of the motion processing system 100. In some embodiments, processing circuitry 140 may include hardware control logic that may be integrated within a chip of a sensor package (e.g., on a substrate or cap of a MEMS sensor package, or on an adjacent portion of a chip to the sensor package) such as the MEMS sensors 120 to control the operation of the MEMS sensors 120 and perform aspects of processing for the MEMS sensors 120. In some embodiments, the MEMS sensors 120 may include one or more registers that allow aspects of the operation of the hardware control logic (e.g., drive magnitude, gain factors applied to measured signals, etc.) to be modified (e.g., by modifying a value of a register).

Other MEMS devices 180 may operate in a similar manner. In some embodiments, processing circuitry 140 may include a processor such as a microprocessor that executes software instructions, e.g., that are stored in memory 160. The microprocessor may control the operation of the MEMS sensors 120 by interacting with the hardware control logic, and process measurement signals received from MEMS sensors 120. The microprocessor may interact with other sensors in a similar manner.

Although in some embodiments (not depicted in FIG. 1), the MEMS sensors 120 or other MEMS devices 180 may communicate directly with external circuitry (e.g., via a serial bus or direct connection to sensor outputs and control inputs), in an embodiment the processing circuitry 140 may process data received from the MEMS sensors 120 and other MEMS devices 180 and communicate with external components via a communication interface 110 (e.g., a SPI or I2C bus, or in automotive applications, a controller area network (CAN) or Local Interconnect Network (LIN) bus). The processing circuitry 140 may convert signals received from the MEMS sensors 120 and other MEMS devices 180 into appropriate measurement units (e.g., based on settings provided by other computing units communicating over the communication bus 110) and perform more complex processing to determine measurements such as orientation or Euler angles, and in some embodiments, to determine from sensor data whether a particular activity (e.g., walking, running, braking, skidding, rolling, etc.) is taking place.

In some embodiments, certain types of information may be determined based on a data from multiple gyroscopes 120 and MEMS devices 180, in a process that may be referred to as sensor fusion. By combining information from a variety of sensors it may be possible to accurately determine information that is useful in a variety of applications, such as image stabilization, navigation systems, automotive controls and safety, dead reckoning, remote control and gaming devices, activity sensors, 3-dimensional cameras, industrial automation, and numerous other applications.

In some embodiments, one or more MEMS accelerometers may be sealed in a manner that forms an accelerometer cavity. The internal volume of the accelerometer cavity may be at a pressure that is suitable for operation of the one or more MEMS accelerometers. Although the seal for the accelerometer cavity may be formed in any suitable manner, in some embodiments a MEMS accelerometer may include a plurality of semiconductor layers such as a cap layer, a MEMS layer (e.g., including the movable masses, springs, etc. of the MEMS accelerometer), and a CMOS layer (e.g., including processing circuitry, anchoring points for fixed components, etc.). The layers may be stacked and bonded such that the internal volume of the accelerometer cavity formed by these layers is isolated from any external volumes. In some embodiments, it may be desirable to isolate the internal volume of a MEMS accelerometer from external sources in order to prevent contamination (e.g., moisture, particulates, etc.) that may damage the MEMS accelerometer, as well as to maintain a specified pressure within the internal volume of the accelerometer cavity.

In some embodiments, a specified pressure within an internal accelerometer cavity volume may be less than an atmospheric pressure but greater than a vacuum pressure. In some embodiments, the specified pressure may be approximately within an order of magnitude of the atmospheric pressure. A specified pressure may be selected in a manner that optimizes the motion of the movable masses within the system, e.g., to establish a desired damping of the movable masses of the MEMS accelerometer, while avoiding a low pressure and high q-factor condition in which the response of the movable masses may be excessive, erratic, and/or unpredictable.

In some embodiments, one or more MEMS gyroscopes may be sealed in a manner that forms a gyroscope cavity. The internal volume of the gyroscope cavity may be at a pressure that is suitable for operation of the one or more MEMS gyroscopes. Although the seal for the cavity may be formed in any suitable manner, in some embodiments a MEMS gyroscope may include a plurality of semiconductor layers such as a cap layer, a MEMS layer (e.g., including the movable masses, springs, etc. of the MEMS gyroscope), and a CMOS layer (e.g., including processing circuitry, anchoring points for fixed components, etc.). The layers may be stacked and bonded such that the internal volume of the cavity formed by these layers is isolated from any external sources. In an embodiment, it may be desirable to isolate the internal volume of a MEMS gyroscope from external sources in order to prevent contamination (e.g., moisture, particulates, etc.) that may damage the MEMS gyroscope, as well as to maintain a specified pressure within the internal volume of the gyroscope cavity.

In some embodiments, a specified pressure for the internal cavity volume of the MEMS gyroscope may be at a pressure that is close to a vacuum, which may be two or more orders of magnitude less than atmospheric pressure. The q-factor components of a given MEMS gyroscope may increase as the pressure within the gyroscope cavity decreases, and may decrease in response to a higher pressure within the gyroscope cavity. In this manner, the operation and response of components such as a drive oscillator or sense oscillator for a particular gyroscope design may differ based on the pressure within the gyroscope cavity.

In some embodiments, this relationship between pressure and q-factor may be utilized to identify a change in pressure within the gyroscope cavity. In some embodiments, the q-factor of one or more components (e.g., one or more drive masses of a drive oscillator or one or more sense messes of a sense oscillator) may be determined directly, for example, by measuring the oscillation decay time after the mass is forced into motion.

In some embodiments, other operational characteristics of components of the MEMS gyroscope may be measured, e.g., operational characteristics that may be related to the q-factor or that may similarly be impacted by a change in pressure. In an embodiment, a change in q-factor may result in a corresponding change in the drive voltage that is required to drive the drive oscillator. As described herein, drive sense electrodes may sense the movement of the drive masses in response to a particular drive force imparted by the drive electrodes. In some embodiments, a closed loop system may cause the drive voltage to be changed such that a uniform drive motion is maintained (e.g., as sensed by the drive sense electrodes). This drive voltage may thus be related to pressure, as an increase in pressure may result in an increase in the drive voltage required to maintain the drive motion, while a decrease in pressure may result in a decrease in the drive voltage required to maintain the drive motion. In some embodiments, the voltage sensed by the drive sense electrodes may be measured directly and may be associated with changes in pressure, or a ratio of a drive voltage of the drive electrodes and the sensed voltage of the drive sense electrodes may be associated with changes in pressure (e.g., an increase in pressure may increase a ratio of drive voltage to drive sense voltage).

In some embodiments, one or more auxiliary drive electrodes may be coupled to one or more components of the system to cause movement of one or more movable masses due to a voltage applied at the auxiliary drive electrodes. An auxiliary drive electrode may be located adjacent to any suitable movable mass, such as a sense mass or Coriolis mass of a gyroscope design. Auxiliary drive electrodes may cause movement while the gyroscope is not otherwise being driven, or in some embodiments, during the normal operation of the MEMS gyroscope (e.g., while a drive voltage is being applied to the drive oscillator). Motion caused by the auxiliary drive electrodes may be sensed by other electrodes (e.g., sense electrodes adjacent to a sense mass driven by auxiliary drive electrodes) and the sensed voltage, the auxiliary drive voltage, and/or a ratio of the auxiliary drive voltage or sensed voltage may be used to sense changes in the operation of the MEMS gyroscope that may be due to changes such as a pressure change within the gyroscope cavity in a similar manner as with a drive mass as described herein.

Other factors may also impact the q-factor or other operational characteristics of a gyroscope. In an embodiment, a q-factor or other operational characteristics may change based on a temperature of the MEMS gyroscope. Accordingly, in some embodiments, information from additional sensors such as temperature sensors may be utilized to assist in determining a cause in a change in q-factor or other operational characteristics.

As described above, in some embodiments a specified pressure for a gyroscope cavity may be near vacuum (e.g., to optimize a q-factor for efficient operation of the MEMS gyroscope) while a specified pressure for an accelerometer cavity may be greater by an order of magnitude or more (e.g., in order to provide appropriate damping for the movable masses of the MEMS accelerometer). The MEMS gyroscope may continue to operate at pressures greater than the gyroscope specified pressure, but performance may be compromised as a result of reduced drive motion, excessive power consumption required to provide a drive force, and reduced sense movement. Nonetheless, in some instances it may be possible to compensate for non-ideal pressure within the gyroscope cavity by modifying operational parameters of the MEMS gyroscope, e.g., by adjusting (e.g., increasing) the drive voltage, modifying scaling factors for the sense electrodes (e.g., to account for reduced motion of the sense oscillators), any other suitable modifications, or any suitable combination thereof.

In an embodiment, once a first threshold pressure of the gyroscope cavity is exceeded for a particular MEMS gyroscope design (e.g., as determined by measuring q-factor, drive voltage, drive sense voltage, drive ratio, sense oscillator response, etc.,), compensation may be utilized to allow the MEMS gyroscope to operate under the non-ideal pressure conditions. Eventually compensation techniques may become ineffective, such that the gyroscope should no longer continue to operate to measure angular velocity. In some embodiments, this point may be identified based on a pressure of the gyroscope cavity exceeding a second threshold (e.g., as determined by measuring q-factor, drive voltage, drive sense voltage, drive ratio, sense oscillator response, etc.). In some embodiments, although the MEMS gyroscope may not be used to determine angular velocity, masses may be driven and sensed in a manner to continue to measure pressure within the gyroscope cavity.

In some embodiments, a MEMS accelerometer may continue to operate at pressures that are less or greater than the accelerometer specified pressure, but performance may be compromised as a result of excessive or unpredictable motion of the moveable masses in response to linear acceleration, based on an excessive q-factor causing limited damping for the accelerometer design, resulting in reduced sense accuracy and reduced capability of external shock rejection. Nonetheless, in some instances it may be possible to compensate for non-ideal pressure within the accelerometer cavity by modifying operational parameters of the MEMS accelerometer, e.g., by modifying scaling factors for the sense electrodes, applying compensating forces on the movable mass by the sense electrodes or additional electrodes (e.g., compensating electrodes located adjacent to the sense electrodes) in a manner that provides compensatory damping force, any other suitable modifications, or any suitable combination thereof. In an embodiment, once the pressure within the accelerometer cavity falls above or below pressure thresholds for a particular MEMS accelerometer design (e.g., as determined by a measurements from a gyroscope within a gyroscope cavity enclosing an accelerometer cavity, as described hereafter), compensation may be utilized to allow the MEMS accelerometer to operate under the non-ideal pressure conditions. Eventually compensation techniques may become ineffective, such that the accelerometer should no longer continue to operate. In some embodiments, this point may be identified based on a pressure of the accelerometer cavity falling above or below thresholds (e.g., determined by the gyroscope as described hereafter), based on the compensatory damping voltage/current/power exceeding a threshold, based on the sense resolution falling below a threshold, other suitable criteria, or any suitable combination thereof.

Figure 2:
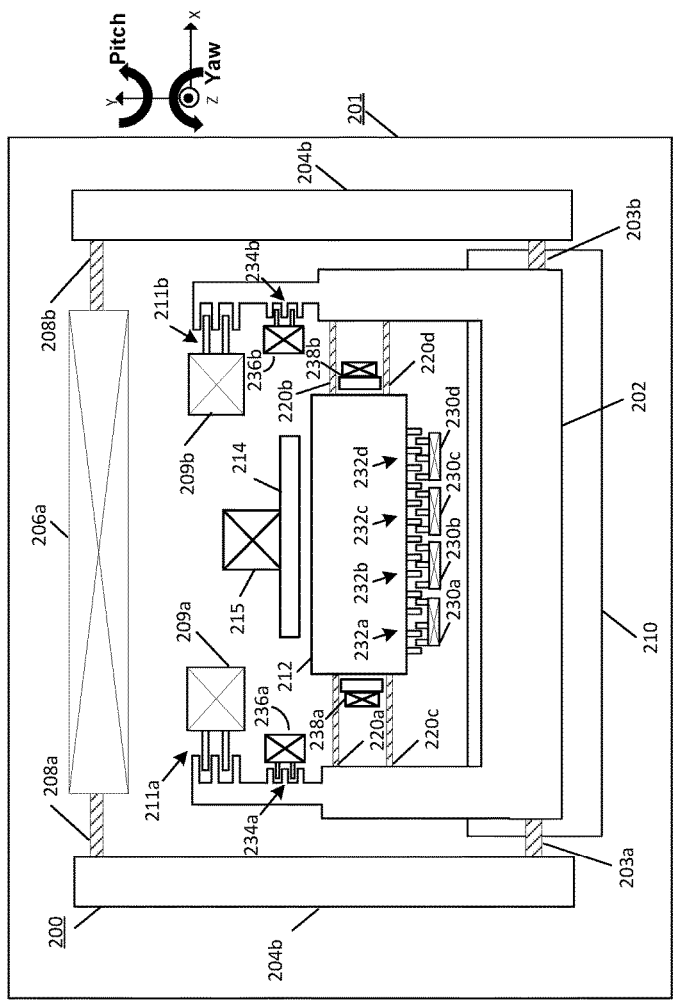
FIG. 2 depicts an exemplary gyroscope design in accordance with some embodiments of the present disclosure.

FIG. 2 depicts an exemplary gyroscope design that may be utilized in accordance with the present disclosure. Although a particular gyroscope design is depicted and described herein for purposes of illustration, it will be understood that the systems and methods described in the present disclosure may be utilized with a variety of gyroscope designs, e.g., as long as it is possible to perform measurements related to pressure, such as q-factor, drive voltage, drive sense voltage, drive ratio, sense voltage, etc. Thus, it will be understood that the discussion provided herein is general to gyroscope designs, and a particular design is provided solely for illustrative purposes. In the exemplary embodiment of FIG. 2, the gyroscope is depicted and described as a two-axis gyroscope having a single drive motion for sensing a pitch rotation about the Y-axis and a yaw rotation about the Z-axis. However, it will be understood that the systems and methods of the present disclosure may be implemented with any suitable gyroscope design (e.g., single axis, three axis) including suitable components and processing (e.g., drive sense electrodes for feedback, auxiliary drive electrodes for sense oscillator testing, sense electrodes, and related processing as described herein) for measuring q-factor or other operational characteristics related to gyroscope cavity pressure. For example, in an exemplary embodiment of a three-axis gyroscope having a single drive motion for multiple drive and sense masses associated with different sense axes, drive sense electrodes may be installed at any or all of the driven masses, and auxiliary drive electrodes may be installed at any or all of the sense masses (and in some embodiments, Coriolis masses).

An exemplary gyroscope 200 is disposed in an X-Y plane parallel to a substrate 201. A Z-direction is normal to the X-Y plane, and the substrate 201 is located below the gyroscope 200 in the Z-direction. The gyroscope 200 includes guiding arms 204a and 204b that are flexibly coupled via springs 208a and 208b to the substrate 201 via at least one anchoring point 206a. The two guiding arms 204a and 204b are flexibly coupled to pitch mass 202 via springs 203a and 203b. In an embodiment, the pitch mass 202 may function as both a drive oscillator and a sense oscillator. The pitch mass 202 in turn is coupled to another sense oscillator such as yaw mass 212 via springs 220a, 220b, 220c, and 220d.

The pitch mass 202, guiding arms 204a and 204b, anchoring point 206a, and springs 203a, 203b, 208a, and 208b form a planar four-bar linkage. Each spring 203a, 203b, 208a, and 208b is compliant in-plane about an axis in the Z-direction so that each guiding arm 204a and 204b can rotate in-plane while the pitch mass 202 translates in an X-direction, e.g., in response to a Coriolis force in the Z-direction caused by a pitch rotation about the Y-axis.

The springs 208a and 208b are compliant about the pitch-sense axis in the X-direction so that the guiding arms 204a and 204b can rotate out-of-plane. The springs 203a and 203b are stiff in the Z-direction, whereby out-of-plane rotation of the guiding arms 204a and 204b causes the pitch mass 202 to move out-of-plane with the guiding arms 204a and 204b.

Electrostatic actuators, such as comb drives 211a and 211b, are connected to anchors 209a and 209b, and to the pitch mass 202. The comb drives 211a and 211b collectively drive the pitch mass 202 along the X-axis in the X-direction. In this embodiment, two electrostatic actuators are utilized. However, one of ordinary skill in the art readily recognizes that one electrostatic actuator can be provided and the use of one electrostatic actuator would be within the spirit and scope of the present invention, and that additional electrostatic actuators may be located in a variety of locations attached to the pitch mass 202. Moreover, although not depicted in the exemplary embodiment of FIG. 2, in an embodiment, one or more drive masses could be coupled to the pitch-pitch mass 202, such that the drive mass is driven by the comb drives 211a and 211b, and the drive motion is imparted upon the pitch mass 202 by additional springs (not depicted in FIG. 2) that are coupled between the drive mass and pitch mass 202 and that are rigid in the X-direction.

In addition, although electrostatic actuators will be described throughout this specification as the actuators being used to drive the guided mass systems, one of ordinary skill in the art recognizes that a variety of actuators could be utilized for this function and that use would be within the spirit and scope of the present invention. For example, the actuators could be piezoelectric, thermal or electromagnetic or the like.

In an embodiment, gyroscope 200 may include components for sensing the drive motion of the pitch mass 202. Although drive sensing may be performed in any suitable manner (e.g., optical sensing, electrode (capacitive) sensing, etc.), in an exemplary embodiment the drive sensing may be performed by pairs of drive sense electrodes 234a/236a and 234b/236b. Although the drive sense electrodes 234a/236a and 234b/236b may be implemented in a variety of manners (e.g., as capacitive plates), in the exemplary embodiment of the gyroscope 200 of FIG. 2 the drive sense electrodes 234a/236a and 234b/236b may be implemented as opposing combs attached respectively to the driven pitch mass 202 (e.g., drive sense combs 234a/234b) and fixedly anchored to the substrate 201 (e.g., drive sense combs 236a/236b).

In an embodiment, the drive sense electrodes 234a/236a and 234b/236b may sense the drive motion of the pitch mass 202 along the drive axis (i.e., the X-axis), providing an indication of the movement of the pitch mass 202 in response to the forces imparted by the drive combs 211a/211b. In some embodiments, this sensed voltage may be used in a feedback system, wherein the drive voltage of the drive combs 211a/211b is adjusted to keep a constant drive movement as indicated by a constant response of the drive sense electrodes 234a/236a and 234b/236b. In some embodiments, when an increased drive voltage is required to generate the same movement of the pitch mass 202, this may be indicative of a change (e.g., a drop) in the q-factor of the drive system (e.g., as a result of an increase in pressure). As described herein, in some embodiments a drive ratio may be determined based on the respective drive and sense voltages, and used to calculate q-factor or other operational characteristics that may be responsive to factors such as a change in pressure.

In some embodiments, the response of the drive system may be measured based on drive and sense voltages that are applied/measured outside of the normal operation of gyroscope 200. For example, one or more drive test voltages may be applied by the drive combs 211a/211b at various times (e.g., during startup of the gyroscope 200, or periodically during operation) and the responsive movement measured by drive sense electrodes 234a/236a and 234b/236b may be used to determine q-factor or other measured characteristics associated with pressure. In an exemplary embodiment, a series of test drive voltages having different values may be applied to the drive combs 211a/211b and responses may be measured by the drive sense electrodes 234a/236a and 234b/236b. In this manner, a profile of differing responses may be measured and analyzed to identify changes to the operation of the gyroscope 200 (e.g., by distinguishing between different causes of changes such as changes in pressure or temperature). In an embodiment, such a test profile could be applied to the gyroscope 200 periodically during operation, and during times when the gyroscope 200 is not in use.

When the gyroscope 200 is driven, the guiding arms 204a and 204b rotate in-plane and the pitch mass 202 translates in-plane in the X-direction. Angular velocity about a pitch-input axis in the Y-direction that is in the plane of the substrate and orthogonal to the X-direction will cause a Coriolis force to act on the pitch mass 202 in the Z-direction. The Coriolis force causes the gyroscope pitch mass 202 and the guiding arms 204a and 204b to rotate out-of-plane. The amplitude of the rotation of the gyroscope 200 is proportional to the angular velocity about the pitch-input axis. A pitch transducer 210 may sense the movement of the sense mass, and may be any suitable pitch transducer 210 such as a capacitive, piezoelectric, or optical transducer, or the like. In an embodiment, a sense electrode 210 under the pitch mass 202 is used to detect the rotation of the gyroscope 200 about the pitch-sense axis, based on the change in capacitance due to the changes in the distance between the pitch mass 202 (e.g., including a moving electrode or functioning as the moving electrode) and the sense electrode 210. This change in capacitance provides a measure of the angular velocity about the pitch-input axis.

Gyroscope 200 also includes a yaw sense oscillator such as yaw mass 212, which responds to a rotation about the Z-axis. In an embodiment, the yaw mass 212 may be coupled to the pitch mass 202 by springs 220a, 220b, 220c, and 220d. Although four springs 220a-220d are depicted in FIG. 2, it will be understood that any suitable number of springs may transfer the drive force to the yaw mass 212 in accordance with the present disclosure. In an embodiment, the springs 220a-220d may be configured to be rigid in the drive direction (i.e., the X-direction) and flexible in the sense direction (i.e., the Y-direction). Moreover, it will be understood that in some embodiments (not depicted in FIG. 2) the yaw oscillator may be implemented as a plurality of masses, such as a Coriolis mass coupled to receive the drive force from the pitch mass 202 and an additional proof mass connected to the Coriolis mass by additional springs that are rigid in the direction of a Coriolis force (e.g., in the Y-direction) imparted on the Coriolis mass due to a yaw rotation.

As described herein, the drive combs 211a and 211b cause the pitch mass 202 to vibrate in the X-direction. This X-direction vibration is transferred to the yaw mass 212 by the springs 220a-220d, which are rigid in the X-direction. In an embodiment, yaw drive sense electrodes 238a/238b may be located adjacent (e.g., in plane) to the yaw mass 212 in the drive direction (e.g., X-direction) of yaw mass 212. Yaw drive sense electrodes 238a/238b may sense the drive motion of the yaw mass 212 along its drive axis (i.e., the X-axis), providing an indication of the movement of the yaw mass 212 in response to the forces imparted by the drive combs 211a/211b (e.g., as transferred to the yaw mass 212 by the pitch mass 202 and the springs 220a/220b/220c/220d). In some embodiments, this sensed voltage may be used to measure the responsive movement of the yaw mass 212 to a particular drive voltage imparted by the drive combs 211a/211b, providing a measurement of the overall response of the pitch mass 202, springs 220a/220b/220c/220d, and yaw mass 212 to the drive force, which may be indicative of a change (e.g., a drop) in the q-factor of the drive system (e.g., as a result of an increase in pressure).

In some embodiments a drive ratio may be determined based on the drive voltage of the drive combs 211a/211b and the voltage sensed by the yaw drive sense electrodes 238a/238b, and used to calculate q-factor or other operational characteristics that may be responsive to factors such as a change in pressure. In some embodiments, the response of the yaw mass 212 may be measured based on drive and sense voltages that are applied/measured outside of the normal operation of gyroscope 200. For example, one or more drive test voltages may be applied by the drive combs 211a/211b at various times (e.g., during startup of the gyroscope 200, or periodically during operation) and the responsive movement measured by yaw drive sense electrodes 238a/238b may be used to determine q-factor or other measured characteristics associated with pressure. In an exemplary embodiment, a series of test drive voltages having different values may be applied to the drive combs 211a/211b and responses may be measured by the yaw drive sense electrodes 238a/238b. In this manner, a profile of differing responses may be measured and analyzed to identify changes to the operation of the gyroscope 200 (e.g., by distinguishing between different causes of changes such as changes in pressure or temperature). In an embodiment, such a test profile could be applied to the gyroscope 200 periodically during operation, or during times when the gyroscope 200 is not in use.

When the yaw mass 212 is oscillating along the X-axis and the gyroscope 200 is rotated about the Z-axis, this will result in a Y-axis Coriolis force on the yaw mass 212 that causes a Y-axis oscillation at the drive frequency. Because the springs 220a-220d are flexible in the Y-direction, the yaw mass 212 will oscillate in the Y-direction with a magnitude that is proportional to the Coriolis force and thus the angular velocity. A yaw sense electrode 214 may sense the movement of the sense mass, and may be any suitable yaw transducer 210 such as a capacitive, piezoelectric, or optical transducer, or the like. In an embodiment, a yaw sense electrode 214 may be a plate electrode (although in some embodiments, different electrodes such as comb electrodes may be utilized for the yaw sense electrode 214) located in plane with the yaw mass 212 (e.g., anchored to the substrate and electrically connected to sense circuitry via anchor 215) to detect the rotation of the gyroscope 200 about the yaw-sense axis, based on the change in capacitance due to the changes in the distance between the yaw mass 212 (e.g., including a moving electrode or functioning as the moving electrode) and the yaw sense electrode 214. In some embodiments (not depicted in FIG. 2), the yaw sense electrode 214 may be located within an interior cavity of yaw mass 212. However the yaw sense electrode 214 is implemented and arranged, the change in capacitance due to relative movement between yaw sense electrode 214 and yaw mass 212 provides a measure of the angular velocity about the yaw-input axis.

In an embodiment, the yaw mass 212 may be configured to be directly driven to test the response of the yaw mass 212 in the sense direction. In some embodiments (not depicted in FIG. 2), the driving of the yaw mass 212 may be imparted upon the yaw mass 212 by the yaw sense electrode 214. The yaw sense electrode 214 may be functionally multiplexed such that it actively switches between providing test signals, measuring test responses, and measuring Coriolis forces. In addition to sense circuitry designed to receive and process the Coriolis forces and test responses, the sense electrode may also include drive circuitry to provide voltage necessary to impart the test signal on the yaw mass 212.

In an embodiment, auxiliary actuators 232a-232d may cause the test movement of the yaw mass 212. Although auxiliary actuators 232a-232d may utilize any suitable method (e.g., piezoelectric, thermal, electromagnetic, etc.) of causing the movement of the yaw mass 212, in an embodiment the auxiliary actuators 232a-232d may be electrostatic comb actuators located in plane and on the periphery of the yaw mass 212. In other embodiments, the auxiliary actuators 232a-232d may be located at other suitable locations, such as within an interior cavity of the yaw mass 212.

In an embodiment, the comb auxiliary actuators 232a-232d may be anchored to the substrate, and connected to drive and/or sense circuitry, via respective anchors 230a-230d. Although four actuators are depicted in FIG. 2, in different embodiments any suitable number of actuators may be utilized to cause test oscillations of the yaw mass 212 in the sense direction (i.e., Y-direction). In some embodiments, rather than sensing the responsive movement of the yaw mass 212 at the yaw sense electrode 214, one or more of the comb electrodes 232a-232d may function as sense combs, in either a dedicated or multiplexed manner (e.g., multiplexed with the actuation of the test signals and/or the measurement of other test responses).

The forces that are applied to the yaw mass 212 by the comb auxiliary actuators 232a-232d are applied and sensed along the Y-axis, which is permitted due to the flexibility of the springs 220a-220d in the Y-axis. As described herein, the movement of the yaw mass 212 along the sense axis (i.e., Y-axis) may be sensed based on a voltage at yaw sense electrode 214 and/or one or more auxiliary actuators 232a-232d. In some embodiments, this sensed voltage may be used to measure the responsive movement of the yaw mass 212 to a particular voltage imparted upon the yaw mass 212 (e.g., by yaw sense electrode 214 and/or auxiliary actuators 232a-232d). In some embodiments, changes in this movement may be indicative of a change in the q-factor (e.g., a drop) or other characteristics of the yaw mass 212 and related components (e.g., springs 220a/220b/220c/220d), e.g., as a result of an increase in pressure. In some embodiments a drive ratio may be determined based on the drive voltage of the auxiliary actuators 232a-232d and the voltage sensed by the yaw sense electrode 214, and used to calculate q-factor or other operational characteristics that may be responsive to factors such as a change in pressure.

In some embodiments, the response of the yaw mass 212 may be measured based on drive and sense voltages that are applied/measured outside of the normal operation of gyroscope 200. For example, one or more drive test voltages may be applied by the auxiliary actuators 232a-232d at various times (e.g., during startup of the gyroscope 200, or periodically during operation) and the responsive movement measured by yaw sense electrode 214 may be used to determine q-factor or other measured characteristics associated with pressure. In an exemplary embodiment, a series of test drive voltages having different values may be applied to the auxiliary actuators 232a-232d and responses may be measured by the yaw sense electrode 214. In this manner, a profile of differing responses may be measured and analyzed to identify changes to the operation of the gyroscope 200 (e.g., by distinguishing between different causes of changes such as changes in pressure or temperature). In an embodiment, such a test profile could be applied to the gyroscope 200 periodically during operation, or during times when the gyroscope 200 is not in use.

The test responses described herein may be processed by circuitry of the gyroscope 200, and in some embodiments, processing circuitry 140. Based on analysis of the test responses, it may be determined whether the gyroscope 200 has failed or whether it is possible to compensate for any changes in gyroscope behavior. In some embodiments as described herein, a change in pressure may be determined to be related to a broken seal of an accelerometer cavity that is sealed within the gyroscope cavity. In such embodiments, it may be determined whether to compensate for the operation of the accelerometer or if the accelerometer has failed. If compensation of either or both of the gyroscope 200 and the accelerometer is possible, one or more operational parameters of the gyroscope 200 or the accelerometer may be modified.

In an embodiment of compensation of gyroscope 200, exemplary modifications may include modification of the magnitude of the drive signal provided by the comb electrodes 211a and 211b, the operation of analog sensing circuitry (e.g., one or more amplifiers of the sense circuit of gyroscope 200), or one or more digital scaling factors (e.g., at gyroscope 200 or processing circuitry 140). In an embodiment of compensation of the accelerometer, exemplary modifications include providing a compensating damping force from one or more electrodes adjacent to one or more movable electrodes of the accelerometer, modifying the operation of analog sensing circuitry (e.g., one or more amplifiers of the sense circuit of the accelerometer), or one or more digital scaling factors (e.g., at the accelerometer or processing circuitry 140).

Figure 3:
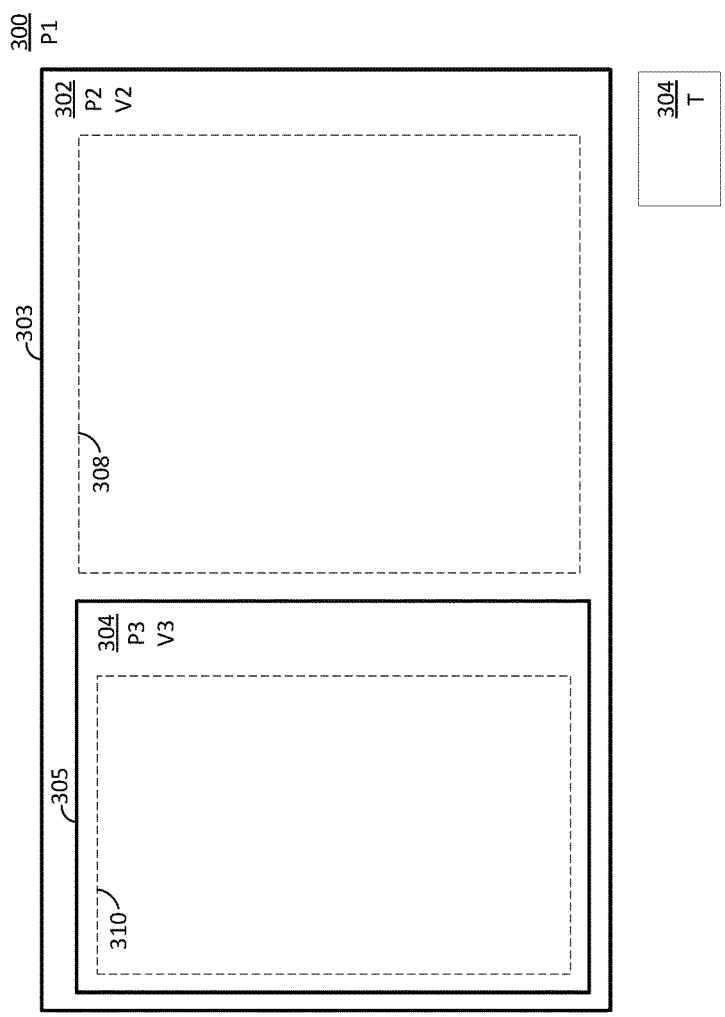
FIG. 3 depicts an exemplary sealed MEMS package in accordance with some embodiments of the present disclosure.

FIG. 3 depicts an exemplary sealed MEMS package in accordance with some embodiments of the present disclosure, which may be a suitable collection of MEMS components such as a monolithic MEMS die. FIG. 3 depicts the components of the MEMS package as a functional block diagram, including a gyroscope seal 303 of the MEMS package defining a gyroscope cavity 302 having a gyroscope 308 (e.g., a multi-axis MEMS gyroscope as depicted and described in FIG. 2) located therein. In an embodiment, an accelerometer seal 304 may be located entirely within the gyroscope cavity 302 and may define an accelerometer cavity 304 that includes one or more accelerometers 310 (e.g., accelerometers as described herein) located therein. An external pressure region 300 having an external pressure P1 (e.g., atmospheric pressure) may be located outside of the gyroscope cavity 302 and may be isolated from a pressure P2 within the gyroscope cavity 302 by the gyroscope seal 303. The accelerometer seal 305 may isolate a pressure P3 within the accelerometer cavity 304 from the gyroscope pressure P2 within the gyroscope cavity 302. The accelerometer cavity 304 may have an accelerometer volume V3, and the gyroscope cavity 302 may have a gyroscope volume V2, which is equal to the overall volume of the gyroscope cavity minus the accelerometer volume V3 and the volume occupied by the accelerometer seal 305.

Although it will be understood that the MEMS sensor of FIG. 3 may be constructed in any suitable manner, in an embodiment the MEMS sensor of FIG. 3 may be conducted with a single cap layer and a single CMOS layer, and with independent MEMS layers for each of the accelerometer region 310 and gyroscope region 308 bonded therebetween to form the gyroscope seal 303 and the accelerometer seal 305. In an exemplary embodiment, aspects of the processing circuitry 140 may be implemented in the CMOS substrate (e.g., as hardware logic) to perform aspects of the processing and/or to communicate with other processing (e.g., a microprocessor of processing circuitry 140) to perform said processing. In an embodiment, a temperature sensor 304 may be provided to determine a temperature at or near the MEMS sensor. Although temperature sensor 304 is depicted external to the MEMS sensor (e.g., outside of gyroscope seal 303) it will be understood that in some embodiments temperature sensor may be located within the gyroscope cavity 302.

As depicted in FIG. 3, accelerometer cavity 304 may be located entirely within gyroscope cavity 302, and under normal operating conditions may be isolated from gyroscope cavity 302 by accelerometer seal 305. In an exemplary embodiment, under normal operating conditions the accelerometer pressure P3 may be greater than the gyroscope pressure P2, for example, by at least an order of magnitude. If the accelerometer seal 305 is broken, the pressures within the accelerometer cavity 304 and the gyroscope cavity 302 may begin to equalize, at a rate that is based on the severity of the break in the accelerometer seal, until the accelerometer pressure P3 within the accelerometer cavity 304 is equalized with the gyroscope pressure P2 within the gyroscope cavity 302. The resulting equalized pressure $P_E$ may be based on the initial gyroscope pressure P2, the initial gyroscope volume V2, the initial accelerometer pressure P3, and the initial gyroscope volume V3.

As described herein, q-factor or other operational characteristics of the gyroscope within the gyroscope region 308 may be determined during operation of the gyroscope or by occasional or periodic testing. Processing circuitry 114 may utilize these measured values in order to estimate the pressure within the gyroscope cavity 302, and based on that estimated pressure, take corrective action for one or more of the gyroscope and one or more accelerometers. In some embodiments, temperature measurements from temperature sensor 304 may also be taken into account by the processing circuitry 114 in order to distinguish changes in q-factor or gyroscope operation that are a result of temperature rather than pressure. An expected change of q-factor due to temperature can be determined at design stage and a reference dependency curve can be embedded in the processing circuitry. In other embodiments, estimation accuracy can be maximized by measuring (during trimming in production) each device at different temperatures and storing the resulting Q factor values in the processing circuitry, to be used as reference during the check.

In some embodiments, it may be desired to cease operation of both the gyroscope and accelerometer when the measured values from the gyroscope indicate that a change in pressure within the gyroscope cavity 302 exceeds a threshold (e.g., a q-factor threshold, drive voltage threshold, or sense voltage threshold) such as 10% of an initial value. For example, in some safety applications it may be desired that any breakage of either the accelerometer seal 305 or the gyroscope seal 303 result in the immediate shut-down of both the accelerometer and gyroscope. In this manner, a system utilizing the gyroscope or accelerometer measurements may have a minimized risk of incorrect values being provided to other components of the system. In some embodiments, a notification or warning may be provided to external circuitry to indicate the failure of the sensors of the sensor package.

In some embodiments, the measured values may indicate a change of pressure that is less than the equalized pressure. It may be desired to utilize these measured changes to compensate for the operation of one or more of the accelerometer or the gyroscope under such conditions, for example by modifying drive voltage, sense scaling factors or gains, or applying a damping force to movable masses of the accelerometers. In some embodiments, a decision of whether to compensate for one or more of the gyroscope or the accelerometer may be based on a rate of change of the pressure within the gyroscope cavity (e.g., as determined based on the measured values such as q-factor, drive voltage, sense voltage, etc.).

In some embodiments, when the pressure or rate of pressure change within the gyroscope cavity exceeds a threshold, the gyroscope may cease normal functioning to measure angular velocity but may continue to measure q-factor or other operational characteristics that are indicative of changes in pressure, e.g., by applying test drive forces to the drive oscillators and/or sense oscillators and measuring responsive movements by drive sense electrodes and/or sense electrodes. In some embodiments, different thresholds of pressure or rate of change of pressure may be associated with different corrective action, such that compensation may be performed under circumstances (e.g., if both the pressure and rate of change are less than respective thresholds) and failure may occur under certain circumstances (e.g., if either of the pressure or rate of change are greater than respective thresholds). In an embodiment, different thresholds may apply to each of the gyroscope and accelerometers, and in some embodiments, different compensation techniques may be associated with different thresholds. In some embodiments, a notification or warning may be provided to external circuitry to indicate that a seal of the sensor has been broken and that compensation or failure has occurred.

In an embodiment, the measurement values determined by the gyroscope may indicate that the pressure between the accelerometer cavity 304 and the gyroscope cavity 302 has equalized, e.g., based on a known equalization pressure and the rate of change of the pressure within the gyroscope cavity 302 approaching zero. Stabilization at the equalized pressure may indicate that the internal accelerometer seal 305 is broken but the external gyroscope seal 303 is not broken. In some embodiments, one or both of the accelerometers and the gyroscope may continue to operate, since the gyroscope seal 303 continues to protect the accelerometers and gyroscope from external contaminants. For an exemplary accelerometer or gyroscope, compensation may be performed as described herein based on the operation function of the accelerometer or gyroscope at the equalized pressure.

In an embodiment, under circumstances of equalized pressure, the gyroscope may cease normal functioning to measure angular velocity but may continue to measure q-factor or other operational characteristics that are indicative of changes in pressure, e.g., by applying test drive forces to the drive oscillators and/or sense oscillators and measuring responsive movements at drive sense electrodes and/or sense electrodes. In this manner, even if the gyroscope is not functional to measure angular velocity at the higher equalized pressure, the gyroscope may continue to monitor the pressure within the gyroscope cavity to ensure that the gyroscope seal 303 is not broken. The accelerometer may continue to operate at the equalized pressure, with possible compensation to account for the reduced damping at the lower pressure. In some embodiments, a notification or warning may be provided to external circuitry to indicate that the pressure has equalized and that compensation or failure has occurred.

If the measured values of the gyroscope indicate that the pressure within the gyroscope cavity 302 exceeds the equalized pressure, this may be indicative that the gyroscope cavity 302 is exposed to the external pressure P1. Although in some embodiments, it may be possible to temporarily compensate for the operation of one or both of the accelerometer or gyroscope (e.g., up to a pressure threshold or a rate of change threshold), exposure to the external pressure will eventually degrade one or both of the gyroscope or the accelerometer, both may cease to operate and a failure may be indicated. In some embodiments, it may be known that the gyroscope seal 303 is broken (e.g., based on measured values indicating a pressure that exceeds the equalized pressure) but unknown whether the accelerometer seal 305 has been broken. In an embodiment, the accelerometer may continue to operate, but a warning may be provided indicating that measured values from the accelerometer should be monitored for values that are indicative of breakage of the accelerometer seal 305, such as erratic patterns indicative of damage due to contamination within the accelerometer cavity 304, or anomalous output from other available self-test circuitry, indicating possible q-factor variation or contamination. Based on this monitoring, processing circuitry 114 may determine whether to continue to operate the accelerometer or to indicate that an accelerometer failure has occurred.

Figure 4:
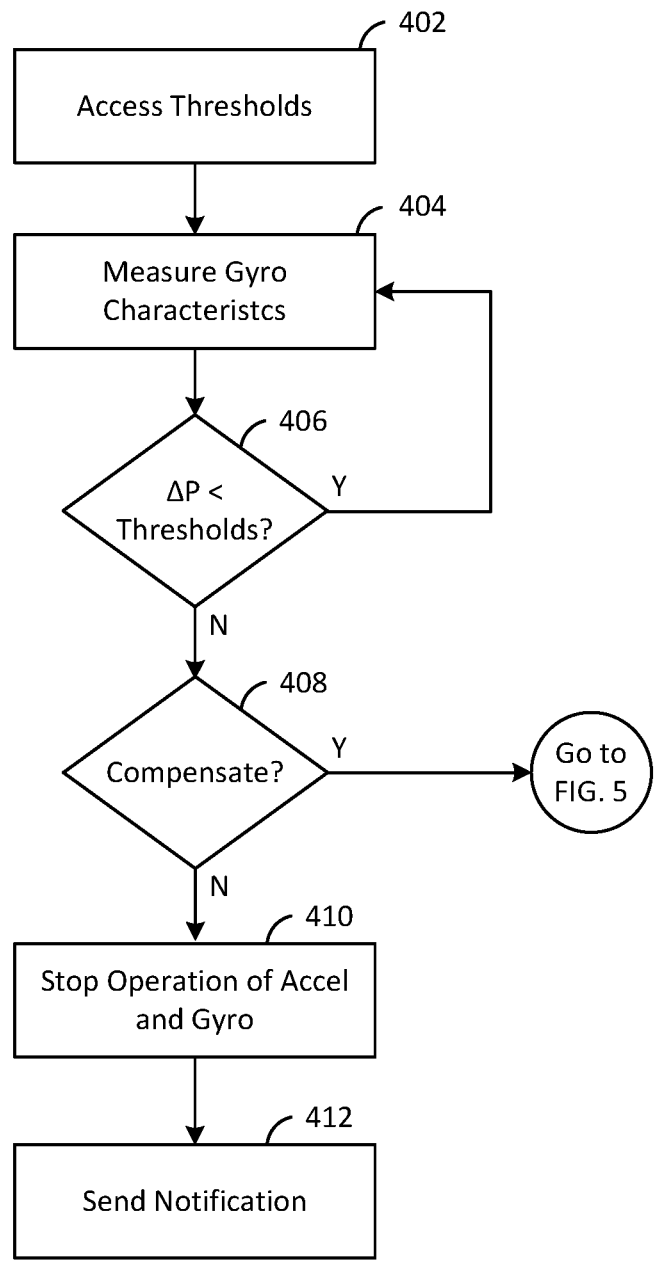
FIG. 4 depicts exemplary steps for identifying a failure due to a damaged seal in accordance with some embodiments of the present disclosure.
Figure 5:
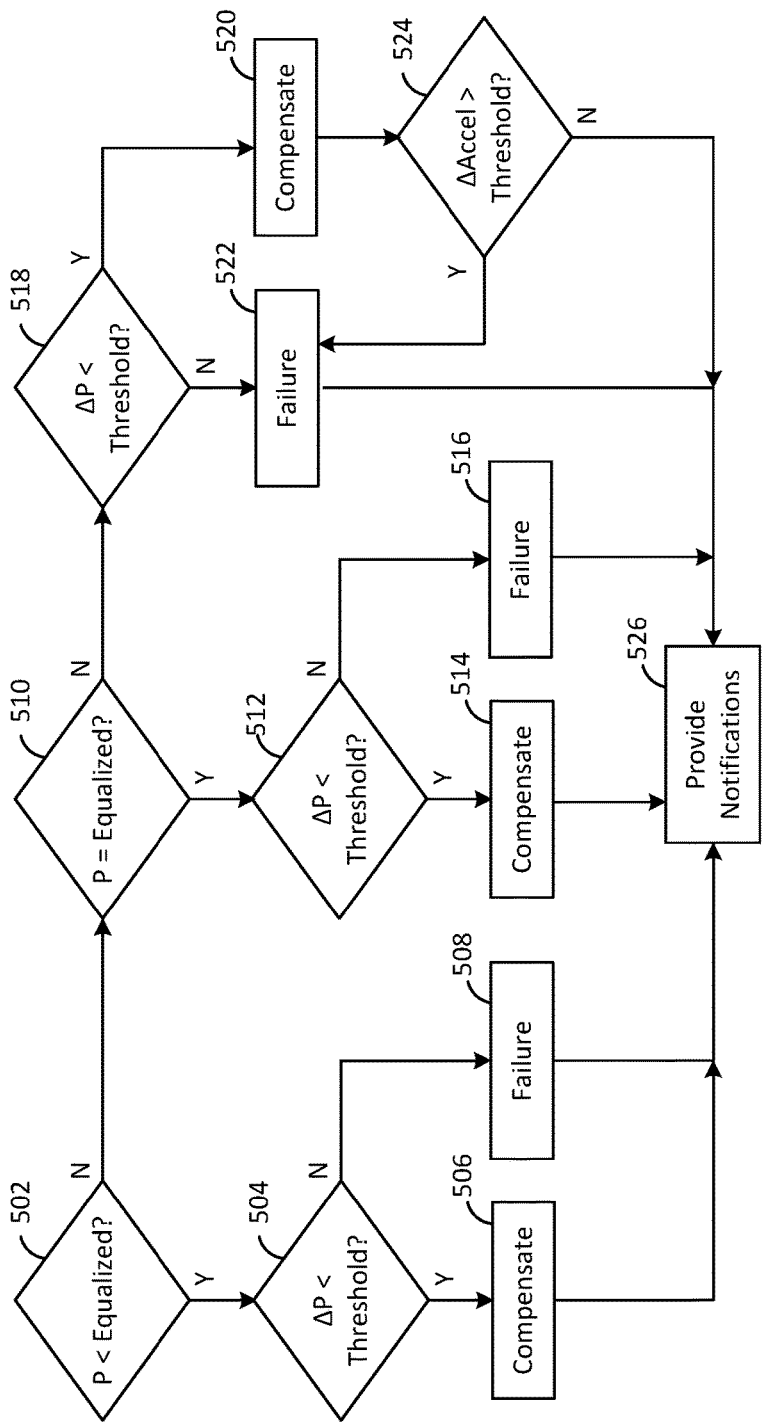
FIG. 5 depicts exemplary steps for compensating in the operations of MEMS sensors in accordance with some embodiments of the present disclosure.

FIGS. 4-5 depict exemplary steps for determining pressure with a gyroscope according to some embodiments of the present disclosure. Although FIGS. 4-5 are described in the context of the present disclosure (e.g., the motion processing system 100, sensors 112, gyroscope 200, and sealed gyroscopes and accelerometers as depicted in FIGS. 1-3), it will be understood that the methods and steps described in FIGS. 4-5 may be applied to a variety of gyroscope designs, accelerometer designs, and sealing configurations. Although a particular order and flow of steps is depicted in FIGS. 4-5, it will be understood that in some embodiments one or more of the steps may be modified, moved, removed, or added, and that the flow depicted in FIGS. 4-5 may be modified.

Although the embodiments of FIGS. 4-5 describe monitoring for an increase in pressure within the gyroscope cavity, it will be understood that gyroscope pressure measurement techniques described in the present disclosure may also measure a decrease in pressure, e.g., as a result of gettering effects. In some embodiments one or more thresholds for a reduction in pressure or a rate of reduction in pressure may be utilized, and compensation or failure analysis may be performed as described herein.

FIG. 4 depicts exemplary steps for identifying a failure due to a damaged seal in accordance with some embodiments of the present disclosure. At step 402, processing circuitry 140 may access thresholds (e.g., from memory 160 or registers of the MEMS sensors) to be used for pressure measurement by a gyroscope (e.g., gyroscope 200) having an accelerometer entirely sealed therein (e.g., by an accelerometer seal 305 located entirely within a gyroscope seal 303). As described herein, a number of thresholds may be provided to measure a number of parameters, such as pressure thresholds (e.g., rate of change, compensation thresholds, failure thresholds, equalized pressure), measured value thresholds (e.g., q-factor, drive voltage, drive sense voltage, auxiliary drive voltage, sense voltage), and scaling factors between pressure thresholds and measured value thresholds. Some or all of the thresholds may be absolute values, and some or all thresholds may be based in part on initial baseline measurements for the gyroscope (e.g., during testing or at startup). Once the thresholds have been accessed, processing may continue to step 404.

At step 404, the characteristics of the gyroscope may be measured to be compared to pressure-related thresholds. The measured characteristics may include any suitable values such as q-factor, drive voltage, voltage of drive sense electrodes, drive voltage of auxiliary drive electrodes, sense voltage, drive ratios, any other suitable characteristics, or any combination thereof. In some embodiments, additional measurements not directly impacted by changes in pressure such as temperature measurements may be made, e.g., to distinguish pressure-related effects from other effects such as temperature. Once the gyroscope characteristics have been measured, processing may continue to step 406.

At step 406, the measured values from step 404, or values (e.g., q-factor or pressure) that are calculated therefrom may be compared to the accessed thresholds from step 402. In some embodiments, one or both of the measured values or the thresholds may be compensated based on other measured or known values such as temperature. As described herein, in some embodiments if no thresholds are exceeded that are indicative of the pressure within the gyroscope cavity exceeding a threshold, or the rate of change of the pressure within the gyroscope cavity exceeding a threshold, this may be indicative that neither the external gyroscope seal nor the internal accelerometer seal has been damaged. If none of these thresholds have been exceeded, processing may return to step 404 to continue measuring the gyroscope characteristics. If any of the thresholds have been exceeded, processing may continue to step 408.

At step 408, it may be determined whether it is possible to compensate for any change in pressure under any conditions. In some exemplary applications, one or both of the gyroscope or the accelerometer may continue to operate under certain conditions (e.g., if the overall pressure drop in the gyroscope cavity is relatively low or if the pressure readings indicate that the external gyroscope seal remains functional). In other applications, it may be desired to cease the operation of both the gyroscope and accelerometer under any indication that either of the gyroscope seal or the accelerometer seal has been broken. If compensation may be possible, processing may continue to FIG. 5. If compensation is not possible, processing may continue to step 410.

At step 410, operation of both the gyroscope and the accelerometer may be stopped. The drive voltages may no longer be provided to the gyroscope, and in some embodiments, power may be removed from both the gyroscope and the accelerometer. Processing may then continue to step 412.

At step 412, a notification may be provided to the processing circuitry or to the external circuitry indicating that the gyroscope and accelerometer have failed. In some embodiments, the notification may also include information about the failure such as measured pressure, q-factor, voltages, drive ratios, which of the seals is broken, or any other suitable information about the failure. The processing of FIG. 4 may then end.

FIG. 5 depicts exemplary steps for compensating in the operations of MEMs sensors in accordance with some embodiments of the present disclosure. As described herein, the steps of FIG. 5 may be initiated based on one or more thresholds being exceeded at step 406 of FIG. 4, and an indication that compensation may be allowed under certain circumstances. In an exemplary embodiment of FIG. 5, different compensation steps may be taken based on whether the pressure within the gyroscope cavity is less than an equalized pressure between the gyroscope and accelerometer cavities, equal to this equalized pressure, or greater than this equalized pressure. However, it will be understood that compensation techniques may be based upon any suitable pressure thresholds or sets of thresholds.

At step 502, it may be determined whether the pressure (or measured value related to pressure) is less than the equalized pressure between the gyroscope and accelerometer cavities. In an embodiment, such a pressure may be indicative that the external gyroscope seal has not been broken and that any change in pressure may be occurring at a relatively slow rate. If the pressure is not less than the equalized pressure, processing may continue to step 510. If the pressure is less than the equalized pressure, processing may continue to step 504.

At step 504, the pressure (or measured values) may be compared to one or more thresholds. In an embodiment, the thresholds may be specific to situations where the measured pressure is less than an equalized pressure. In an embodiment, a rate of change in pressure may be compared to a rate of change threshold, wherein a rate of change less than the threshold is indicative of circumstance under which one or more of the accelerometer or gyroscope may continue to operate. In some embodiments, a plurality of pressure thresholds may provide thresholds at which one or more of the accelerometer or gyroscope may continue to operate, when different compensation techniques may be utilized, or when different warnings or notifications may be provided (e.g., that a measurement has a reduced resolution). Based on the comparisons to the thresholds, it may be determined whether it is possible to compensate for the operation of one or both of the accelerometer or gyroscope, or whether a failure requires both to cease operation. If compensation is possible, processing may continue to step 506. If compensation is not possible, processing may continue to step 508.

At step 506, a compensation technique may be employed to one or both of the accelerometer or the gyroscope as described herein. In some embodiments, it may be determined that the gyroscope should cease normal operation (e.g., to measure angular velocity) but may continue being operated to measure pressure. Once the compensation techniques have been applied to the accelerometer and gyroscope, processing may continue to step 526 for notifications to be provided.

At step 508, operation of both the gyroscope and the accelerometer may be stopped. The drive voltages may no longer be provided to the gyroscope, and in some embodiments, power may be removed from both the gyroscope and the accelerometer. Processing may then continue to step 526 for notifications to be provided.

At step 510, it may have previously been determined that the pressure within the gyroscope cavity is less than the equalized pressure. At step 510, it may be determined whether the pressure (or measured value related to pressure) is equal to the equalized pressure between the gyroscope and accelerometer cavities (e.g., within a threshold above or below the expected equalized pressure). In an embodiment, this determination may also be based on the rate of change of the pressure within the gyroscope being below a threshold that is indicative of a steady state within the gyroscope cavity. In an embodiment, such a pressure may be indicative that the external gyroscope seal has not been broken, that the internal accelerometer seal has been broken, and that the pressure between the cavities has reached a steady state. If the pressure is not equal to the equalized pressure, processing may continue to step 518. If the pressure is equal to the equalized pressure, processing may continue to step 512.

At step 512, the pressure (or measured values) may be compared to one or more thresholds. In some embodiments, the only pressures at which compensation may be allowed may be pressures that are less than the equalized pressure. In some embodiments, any rate of change exceeding a threshold may indicate that the equalized pressure is not at a steady state. In such circumstances, the current equalized pressure may be indicative of a failure and processing may continue to step 516. If the pressure within the gyroscope cavity has been equalized and compensation is permitted, processing may continue to step 514.

At step 514, a compensation technique may be employed to one or both of the accelerometer or the gyroscope as described herein. In some embodiments, it may be determined that the gyroscope should cease normal operation (e.g., to measure angular velocity) but may continue being operated to measure pressure. Once the compensation techniques have been applied to the accelerometer and gyroscope, processing may continue to step 526 for notifications to be provided.

At step 516, operation of both the gyroscope and the accelerometer may be stopped. The drive voltages may no longer be provided to the gyroscope, and in some embodiments, power may be removed from both the gyroscope and the accelerometer. Processing may then continue to step 526 for notifications to be provided.

At step 518, it may have previously been determined at step 502 that the pressure within the gyroscope cavity is not less than the equalized pressure and at step 510 that the pressure is not equal to the equalized pressure. In some embodiments, a pressure greater than the equalized pressure may be indicative that the gyroscope seal has been broken. As described herein, in some embodiments it may be desired to continue to operate the accelerometer on the assumption that the accelerometer seal may not be broken. If so, processing may continue to step 520. If a failure should be indicated, processing may continue to step 522.

At step 520, a compensation technique may be employed to the accelerometer as described herein. In some embodiments, it may be determined that the gyroscope may continue being operated to measure pressure. Processing may then continue to step 524.

At step 524, accelerometer measurements may be compared to previous accelerometer measurements from before the pressure within the gyroscope cavity changed or before changes exceeded a threshold. Any changes in measurement values exceeding a threshold may be indicative that the accelerometer cavity has also been broken, and processing may continue to step 522. If the threshold has not been exceeded, processing may continue to step 526 for notifications to be provided.

At step 522, operation of both the gyroscope and the accelerometer may be stopped. The drive voltages may no longer be provided to the gyroscope, and in some embodiments, power may be removed from both the gyroscope and the accelerometer. Processing may then continue to step 526 for notifications to be provided.

At step 526, a notification may be provided to the processing circuitry or to the external circuitry indicating that the gyroscope and accelerometer have failed or that compensation is occurring. In some embodiments, the notification may also include information about the compensation technique, or information about the failure such as measured pressure, q-factor, voltages, drive ratios, which of the seals is broken, or any other suitable information about the failure. The processing of FIG. 5 may then end.

The foregoing description includes exemplary embodiments in accordance with the present disclosure. These examples are provided for purposes of illustration only, and not for purposes of limitation. It will be understood that the present disclosure may be implemented in forms different from those explicitly described and depicted herein and that various modifications, optimizations, and variations may be implemented by a person of ordinary skill in the present art, consistent with the following claims.

What is claimed is:

1. A microelectromechanical sensor (MEMS) package, comprising:
    a first cavity enclosed by a first cavity seal, wherein the first cavity seal provides a barrier between a first cavity pressure within the first cavity and an external pressure;
    a second cavity enclosed by a second cavity seal, wherein the second cavity seal is located entirely within the first cavity seal to provide a barrier between a second cavity pressure within the second cavity and the first cavity pressure;
    a MEMS accelerometer located within the second cavity and configured to measure one or more linear accelerations; and
    a MEMS gyroscope located within the first cavity and configured to measure one or more angular velocities, wherein the MEMS gyroscope is further configured to sense a change in pressure within the first cavity when at least one of the first cavity seal or the second cavity seal has been broken; and
    processing circuitry coupled to the MEMS gyroscope to identify a failure based on the change in pressure sensed by the MEMS gyroscope.

2. The MEMS package of claim 1, wherein the MEMS gyroscope comprises:
    a plurality of movable masses; and
    one or more drive actuators to drive the movable masses, wherein the MEMS gyroscope identifies the change in pressure within the first cavity based on the movement of one or more of the plurality of movable masses.

3. The MEMS package of claim 2, wherein the MEMS gyroscope comprises one or more sense electrodes configured to output one or more sense signals based on the movement of the one or more movable masses, and wherein the processing circuitry identifies the change in pressure based on the sense signal.

4. The MEMS package of claim 3, wherein the one or more drive actuators drive one or more drive masses of the movable masses, and wherein the one or more sense electrodes comprise drive sense electrodes configured to output the sense signals based on the movement of the drive masses.

5. The MEMS package of claim 4, wherein the processing circuitry is configured to identify the change in pressure when the sense signal is less than a motion threshold for the sense signal.

6. The MEMS package of claim 5, wherein the motion threshold is 10% less than a movement of the drive mass under an initial pressure for the first cavity pressure.

7. The MEMS package of claim 2, wherein the MEMS gyroscope is configured to identify the change in pressure when a drive voltage applied to the drive actuator exceeds a voltage threshold.

8. The MEMS package of claim 7, wherein the voltage threshold is based on a drive voltage difference with an initial drive voltage applied to generate a predefined motion under an initial pressure for the first cavity pressure.

9. The MEMS package of claim 8, wherein the drive voltage difference is 10% higher than the initial drive voltage.

10. The MEMS package of claim 1, wherein the MEMS gyroscope is configured to determine a q-factor for the MEMS gyroscope, and to identify the change in pressure when the q-factor is less than a q-factor threshold.

11. The MEMS package of claim 10, further comprising a temperature sensor, wherein the q-factor threshold is based on a measured temperature of the temperature sensor.

12. The MEMS package of claim 11, wherein the q-factor threshold is 10% less than a q-factor of the MEMS gyroscope under and initial pressure for the first cavity pressure.

13. The MEMS package of claim 1, wherein the processing circuitry is configured to generate a notification when a failure is identified.

14. The MEMS package of claim 1, wherein an initial pressure for the second cavity pressure is at least an order of magnitude less than atmospheric pressure.

15. The MEMS package of claim 14, wherein an initial pressure for the first cavity pressure is approximately an order of magnitude less than the initial pressure for the second cavity.

16. The MEMS package of claim 1, wherein the processing circuitry is further configured to identify the failure based on a comparison of the sensed pressure to a pressure threshold.

17. The MEMS package of claim 1, wherein the processing circuitry is further configured to identify the failure based on a comparison of the sensed pressure over time to a rate of change threshold.

18. The MEMS package of claim 1, wherein the processing circuitry is further configured to identify the failure based on a comparison of the sensed pressure over time to a rate of change threshold and a comparison of the sensed pressure to a pressure threshold.

19. A method for sensing a change in pressure within a microelectromechanical sensor (MEMS) package, comprising:
    determining one or more angular velocities from a MEMS gyroscope, wherein the MEMS gyroscope is located within a first cavity, wherein the first cavity is enclosed by a first cavity seal, wherein the first cavity seal provides a barrier between a first cavity pressure within the first cavity and an external pressure;
    determining one or more linear accelerations from a MEMS accelerometer, wherein the MEMS accelerometer is located within a second cavity enclosed by a second cavity seal, and wherein the second cavity seal is located entirely within the first cavity seal to provide a barrier between a second cavity pressure within the second cavity and the first cavity pressure;
    sensing, by the MEMS gyroscope, a change in pressure within the first cavity when at least one of the first cavity seal or the second cavity seal has been broken; and
    identifying, by processing circuitry, a failure based on the change in pressure sensed by the MEMS gyroscope.

20. A multi-sensor microelectromechanical sensor (MEMS) package, comprising:
- a gyroscope configured to measure angular velocity about one or more axes of rotation, the gyroscope comprising:
  - a plurality of gyroscope movable masses;
  - one or more drive electrodes to drive one or more of the plurality of gyroscope movable masses, wherein the one or more drive electrodes are driven by a drive voltage; and
  - one or more gyroscope sense electrodes to sense the movement of one or more of the plurality of gyroscope movable masses based on a sense voltage of the gyroscope sense electrodes;
- an accelerometer configured to measure linear acceleration along one or more axes, the accelerometer comprising:
  - one or more accelerometer movable masses; and
  - one or more accelerometer sense electrodes to sense the movement of the one or more accelerometer movable masses;
- an accelerometer seal ring that encloses the accelerometer, wherein the accelerometer seal ring provides an accelerometer pressure for an accelerometer cavity within the accelerometer seal ring;
- a gyroscope seal ring that encloses the gyroscope and the entirety of the accelerometer seal ring, wherein the gyroscope seal ring provides a gyroscope pressure for a gyroscope cavity within the gyroscope seal ring, and wherein the accelerometer seal ring provides a barrier between the accelerometer pressure and the gyroscope pressure; and
- processing circuitry configured to sense a change in pressure within the gyroscope cavity based on at least the drive voltage or the sense voltage, and to identify a failure based on the change in pressure.

* * * * *